(12) United States Patent
Nagaoka

(10) Patent No.: US 7,368,799 B2
(45) Date of Patent: May 6, 2008

(54) SEMICONDUCTOR APPARATUS AND METHOD OF MANUFACTURING THE SAME

(75) Inventor: Tatsuji Nagaoka, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 126 days.

(21) Appl. No.: 11/227,958

(22) Filed: Sep. 15, 2005

(65) Prior Publication Data
US 2006/0086998 A1 Apr. 27, 2006

(30) Foreign Application Priority Data
Oct. 27, 2004 (JP) ............................. 2004-311633

(51) Int. Cl.
H01L 29/00 (2006.01)
(52) U.S. Cl. ...................... 257/500; 257/678
(58) Field of Classification Search ................ 257/500, 257/678
See application file for complete search history.

(56) References Cited

FOREIGN PATENT DOCUMENTS

JP 11-204541 A 7/1999

OTHER PUBLICATIONS

Baliga, B. Jayant, "Power Semiconductor Devices," PWS Publishing Company, pp. 519-523.

Nakagawa, Akio, "Impact of Dielectric Isolation Technology on Power ICs," IEEE, 1991, pp. 16-19.

*Primary Examiner*—Long Pham
(74) *Attorney, Agent, or Firm*—Rossi, Kimms & McDowell LLP

(57) ABSTRACT

The semiconductor apparatus is disclosed that includes a partial SOI substrate including an oxide film; a lateral first MOSFET section having a planar gate structure and formed in the portion of the partial SOI substrate where there is an oxide film; a vertical second MOSFET section having a trench gate structure and formed in the portion of the partial SOI substrate where there is no oxide film, the second MOSFET section being adjacent to the first MOSFET section. The first MOSFET section includes a first p-type base region on the oxide film. The second MOSFET section includes a second $n^+$-type drain region, a second n-type drift region on the second $n^+$-type drain region, and a second p-type base region in the surface portion of the second n-type drift region. The height H1 of the pn-junction between the second n-type drift region and the second p-type base region from the second $n^+$-type drain region is set to be lower than the height H2 of the boundary between the oxide film and the first p-type base region from the second $n^+$-type drain region to make the oxide film serve as a field plate. The semiconductor apparatus including a vertical device and a lateral device configured as described above facilitates doping the second n-type drift region heavily while securing a certain breakdown voltage, reducing the ON-resistance of the second MOSFET section, and reducing the semiconductor chip size.

13 Claims, 11 Drawing Sheets

SEMICONDUCTOR APPARATUS AND METHOD OF MANUFACTURING THE SAME

CROSS REFERENCE TO RELATED APPLICATIONS

This application claims priority from application Serial No. JP 2004-311633, filed on Oct. 27, 2004, the contents of which are incorporated herein in their entirety.

BACKGROUND OF THE INVENTION

A. Field of the Invention

The present invention relates to a semiconductor apparatus including a vertical semiconductor device and a lateral semiconductor device formed on a substrate, a part thereof having a SOI structure (hereinafter referred to as a "partial SOI substrate"). The present invention relates also to the method of manufacturing the semiconductor apparatus having the structure as described above.

B. Description of the Related Art

FIG. 22 is a block diagram of a synchronous commutator circuit. The synchronous commutator circuit shown in FIG. 22 supplies electric power to CPU 110 in a computer. High-side MOSFET 101 and low-side MOSFET 102 are connected in series to each other. LC filter 112 formed of coil 107 and capacitor 108 is connected to the connection point of MOSFETs 101 and 102 such that connection point 111 of coil 107 and capacitor 108 is an output point. Free wheel diodes 103 and 104, battery 105, smoothing capacitor 106, control IC 109 and CPU 110 are shown in FIG. 22.

The operations of this synchronous commutator circuit are described below. A certain voltage, e.g. around 12 V, is applied between the drain of high-side MOSFET 101 and the source of low-side MOSFET 102 from battery 105, or other DC power supply. By switching on and off high-side MOSFET 101 and low-side MOSFET 102 alternately at a high frequency (from 500 kHz to 1 MHz), a DC voltage, e.g. around 5 V, is supplied to CPU 110 via LC filter 112, the resonance frequency of which is from 50 kHz to 100 kHz.

The DC voltage becomes higher as the ON-period of high-side MOSFET 101 is longer (as the ON-period of low-side MOSFET 102 is shorter). The DC voltage becomes lower as the ON-period of high-side MOSFET 101 is shorter (as the ON-period of low-side MOSFET 102 is longer). In other words, for supplying a predetermined voltage to CPU 110, it is necessary to set the ON- and OFF-periods of high-side MOSFET 101 and low-side MOSFET 102 at the respective predetermined values. When the ON-period of high-side MOSFET 101 is long, it is necessary to provide high-side MOSFET 101 with a high current capacity. When the ON-period of low-side MOSFET 102 is long, it is necessary to provide low-side MOSFET 102 with a high current capacity. The current that flows through low-side MOSFET 102 flows from its source to its drain, that is in the same direction with the current flow direction (upward in FIG. 22) in free wheel diode 104 connected in opposite parallel to low-side MOSFET 102.

The package, which houses a semiconductor chip mounting high-side MOSFET 101 thereon and a semiconductor chip mounting low-side MOSFET 102 thereon, occupies a large space. To obviate this problem, the package size is reduced by providing high-side MOSFET 101 and low-side MOSFET 102 with respective lateral planar structures and by integrating lateral planar MOSFETs 101 and 102 on the same semiconductor substrate (that is, into one chip) employing the IC techniques and the LSI techniques. However, when MOSFETs 101 and 102 are integrated into one chip, it is necessary to separate MOSFETs 101 and 102 from each other by a device separation region, e.g., an insulating separation region that separates MOSFETs 101 and 102 from each other by an insulator film. The device separation region causes a wide chip area. To narrow the chip area, it may be effective to use a vertical device for the high-side device, corresponding to high-side MOSFET 101, or for the low-side device, corresponding to low-side MOSFET 102.

Alternatively, a method has been disclosed that uses a partial SOI substrate, forms a lateral MOSFET in an area in which an oxide film is formed, and forms a vertical MOSFET in an area in which an oxide film is not formed (cf. JP P Hei. 11 (1999)-204541 A). The method disclosed in the JP P Hei. 11 (1999)-204541 A uses the oxide film in the partial SOI substrate for electrically separating the vertical device and the lateral device from each other. In the disclosed method, the depletion layers for sustaining the breakdown voltage are designed to expand almost throughout the semiconductor section except the insulator film. Due to this design, the impurity concentrations in the drift regions formed in the semiconductor section are set to be low to expand the depletion layers sufficiently. Due to the low impurity concentrations in the drift regions, the ON-resistance and the ON-voltage of each constituent semiconductor device are high. For reducing the ON-voltages, it is necessary to expand the active regions of the devices. In the structure as described, a device separation region and a large active region are necessary to secure a certain breakdown voltage and to reduce the ON-resistance. The device separation region and the large active regions cause a large semiconductor chip.

In view of the foregoing, it would be desirable to obviate the problems described above. It would be desirable to provide a semiconductor apparatus that includes a vertical device and a lateral device formed on the same semiconductor substrate that facilitates securing a predetermined breakdown voltage and reducing the semiconductor chip size. It would be also desirable to provide the method of manufacturing the desirable semiconductor apparatus described above.

The present invention is directed to overcoming or at least reducing the effects of one or more of the problems set forth above.

SUMMARY OF THE INVENTION

According to a first aspect of the invention, there is provided a semiconductor apparatus including:
  a first semiconductor layer having a first major surface and a second major surface;
  a first insulator film formed selectively on the first major surface of the first semiconductor layer;
  a second semiconductor layer of a first conductivity type formed on a portion of the first semiconductor layer where the first insulator film is not formed;
  a third semiconductor layer formed on the first insulator film;
  a fourth semiconductor layer of a second conductivity type formed on the second semiconductor layer or in a surface portion of the second semiconductor layer;
  a separator layer in contact with the first insulator film, the separator layer separating the third semiconductor layer and the fourth semiconductor layer from each other;
  a fifth semiconductor layer of the first conductivity type formed in a surface portion of the fourth semiconductor layer;

a first gate insulator film on an exposed surface of the fourth semiconductor layer exposed between the second semiconductor layer and the fifth semiconductor layer;

a first gate electrode on the first gate insulator film;

a first electrode connected electrically to the fourth semiconductor layer and the fifth semiconductor layer;

a second electrode formed on a second major surface of the first semiconductor layer; and an end portion of a pn-junction between the second semiconductor layer and the fourth semiconductor layer opposite to the gate-electrode-side end portion of a pn-junction being in contact with the first insulator film.

Preferably, the separator layer is a sixth semiconductor layer of the first conductivity type extended from the surface of the third semiconductor layer down to the first insulator film. Also preferably, the separator layer is a second insulator film extended from the surface of the third semiconductor layer down to the first insulator film, and the end portion of the pn-junction between the second semiconductor layer and the fourth semiconductor layer opposite to the first-gate-electrode-side end portion of the pn-junction is in contact with the first insulator film or the second insulator film.

In a preferred embodiment, the fourth semiconductor layer is formed on the second semiconductor layer; the semiconductor apparatus further includes a trench adjacent to the fifth semiconductor layer and extended down to the second semiconductor layer; and the exposed surface of the fourth semiconductor layer is in the trench. Preferably, the first semiconductor layer includes a semiconductor layer of the first conductivity type laminated on a semiconductor layer of the second conductivity type.

According to a second aspect of the invention, there is provided a semiconductor apparatus including:

a first semiconductor layer having a first major surface and a second major surface;

a first insulator film formed selectively on the first major surface of the first semiconductor layer;

a second semiconductor layer of a first conductivity type formed on a portion of the first semiconductor layer where the first insulator film is not formed;

a third semiconductor layer of a second conductivity type formed on the first insulator film;

a fourth semiconductor layer of the second conductivity type formed on the second semiconductor layer or in a surface portion of the second semiconductor layer;

a seventh semiconductor layer of the first conductivity type extended from the surface of the third semiconductor layer down to the first insulator film;

a fifth semiconductor layer of the first conductivity type formed in a surface portion of the fourth semiconductor layer;

a second insulator film on an exposed surface of the fourth semiconductor layer exposed between the second semiconductor layer and the fifth semiconductor layer;

a first gate electrode on the second insulator film;

an eighth semiconductor layer of the first conductivity type formed in a surface portion of the third semiconductor layer, the eighth semiconductor layer being in contact with the seventh semiconductor layer;

a ninth semiconductor layer of the first conductivity type formed in a surface portion of the third semiconductor layer, the ninth semiconductor layer being spaced apart from the eighth semiconductor layer;

a second gate electrode above the extended portion of the third semiconductor layer extended between the eighth semiconductor layer and the ninth semiconductor layer with a second gate insulator film interposed therebetween;

a first electrode connected electrically to the fourth semiconductor layer, the fifth semiconductor layer, and the seventh semiconductor layer;

a second electrode formed on a second major surface of the first semiconductor layer;

a third electrode connected electrically to the ninth semiconductor layer and the third semiconductor layer; and an end portion of a pn-junction between the second semiconductor layer and the fourth semiconductor layer opposite to the gate-electrode-side end portion of a pn-junction being in contact with the first insulator film.

Preferably, the semiconductor apparatus further includes a tenth semiconductor layer of the second conductivity type between the seventh semiconductor layer and the fifth semiconductor layer, and the tenth semiconductor layer is extended more deeply than the fifth semiconductor layer. Also preferably, the tenth semiconductor layer is formed such that the tenth semiconductor layer separates the fourth semiconductor layer and the seventh semiconductor layer from each other. In a preferred embodiment, the tenth semiconductor layer is formed of a plurality of impurity diffusion layers.

Preferably, the semiconductor apparatus further includes an eleventh semiconductor layer of the second conductivity type in the surface portion of the third semiconductor layer spaced apart from the second gate electrode with the ninth semiconductor layer interposed therebetween.

Also preferably, the semiconductor apparatus further includes a third insulator film formed in contact with the first insulator film such that the third insulator film separates the seventh semiconductor layer and the fourth semiconductor layer from each other, and the end portion of the pn-junction between the second semiconductor layer and the fourth semiconductor layer opposite to the first-gate-electrode-side end portion of the pn-junction is in contact with the first insulator film or the third insulator film.

Advantageously, the eighth semiconductor layer is extended down to the first insulator film, and the semiconductor apparatus further includes a fourth insulator film on the eighth semiconductor layer, and a field plate on the fourth insulator film. Also advantageously, the fourth semiconductor layer is formed on the second semiconductor layer; the semiconductor apparatus further includes a trench adjacent to the fifth semiconductor layer and extended down to the second semiconductor layer; and the exposed surface of the fourth semiconductor layer is in the trench.

In a preferred embodiment, the planar patterns of the third semiconductor layer and the fourth semiconductor layer are shaped with respective stripes, and the extension line of the fourth semiconductor layer in the longitudinal direction thereof and the longitudinal direction of the third semiconductor layer cross each other at right angles. Advantageously, the semiconductor apparatus includes a plurality of structures in which the third semiconductor layer surrounds the fourth semiconductor layer. In another embodiment, the semiconductor apparatus includes a plurality of structures in which the fourth semiconductor layer surrounds the third semiconductor layer. In one embodiment, the semiconductor apparatus further includes a twelfth semiconductor layer of the second conductivity type between the first semiconductor layer and the third semiconductor layer.

According to a third aspect of the invention, the semiconductor apparatus is manufactured through the steps of:

forming a first insulator film selectively on a first major surface of a first semiconductor layer;

forming a second semiconductor layer by epitaxial growth from the surface of the first semiconductor layer where there is no first insulator film, the second semiconductor layer being thinner than the first insulator film;

forming a fourth semiconductor layer by epitaxial growth from the surface of the second semiconductor layer; and forming a third semiconductor layer by epitaxial growth from the surface of the second semiconductor layer.

Since the insulator layer buried in the semiconductor as described above works not only for device separation but also as a field plate, the breakdown voltage is improved. In other words, the drift regions may be doped heavily. These effects may be understood by considering the electric field distribution and the potential distribution in the structure as shown in FIG. 23. The electric field distribution and the potential distribution across the diode structure shown in FIG. 24(a) are obtained by the well known depletion layer approximation and shown in FIGS. 24(b) and 24(c), respectively.

The electric field distribution and the potential distribution across the capacitor structure shown in FIG. 25(a) are shown in FIGS. 25(b) and 25(c), respectively. Since the electric field across the diode structure and the electric field across the capacitor structure distribute such that the electric fields are connected smoothly, the electric field distribution across the semiconductor region in FIG. 23 is flattened more than the electric field distribution shown in FIG. 24(b) for the discrete diode structure. If one considers the functions described above for the semiconductor apparatus (MOSFETs) according to the invention, it is possible to make the insulator film (oxide film) arranged appropriately in the vicinity of the drift region serve as a field plate. Since the electric field distributes uniformly throughout the insulator layer, the electric field is relaxed throughout the entire region into which the depletion layer expands, by extending the insulator layer as long as or longer than the drift region length.

By setting the surface height of the oxide film in the SOI substrate to be higher than the surface height of the drift region in the vertical device, the oxide film in the SOI substrate is made to serve as a field plate. Therefore, by doping the drift region in the vertical device more heavily, the ON-resistance is reduced and the semiconductor chip size is reduced while securing a certain breakdown voltage according to the invention. By removing the insulator film between the side faces of the vertical and lateral devices such that the vertical device and the lateral device are in direct contact with each other, the semiconductor chip size is reduced while securing a certain breakdown voltage. By reducing the semiconductor chip size as described above, the semiconductor apparatus package size is reduced and the size of the synchronous commutator circuit that uses the semiconductor apparatus package is also reduced. By disposing an insulator film between the vertical device and the lateral device, the leakage currents of the vertical and lateral devices are reduced.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Now the invention will be described in detail hereinafter with reference to the accompanied drawing figures which illustrate the preferred embodiments of the invention.

In the following descriptions, the p-type layer or the p-type region is a layer or a region in which holes are majority carriers. The n-type layer or the n-type region is a layer or a region in which electrons are majority carriers. The suffix "+" attached to the letter "n" or "p" indicating the conductivity type of the layer or the region indicates that the layer or the region is doped relatively heavily. The suffix "−" attached to the letter "n" or "p" indicating the conductivity type of the layer or the region indicates that the layer or the region is doped relatively lightly. Although the first conductivity type is an n-type and the second conductivity type is a p-type in the semiconductor apparatuses according to the invention, the invention also is applicable to the semiconductor devices in which the first conductivity type is a p-type and the second conductivity type is an n-type.

First Embodiment

Figure 1:
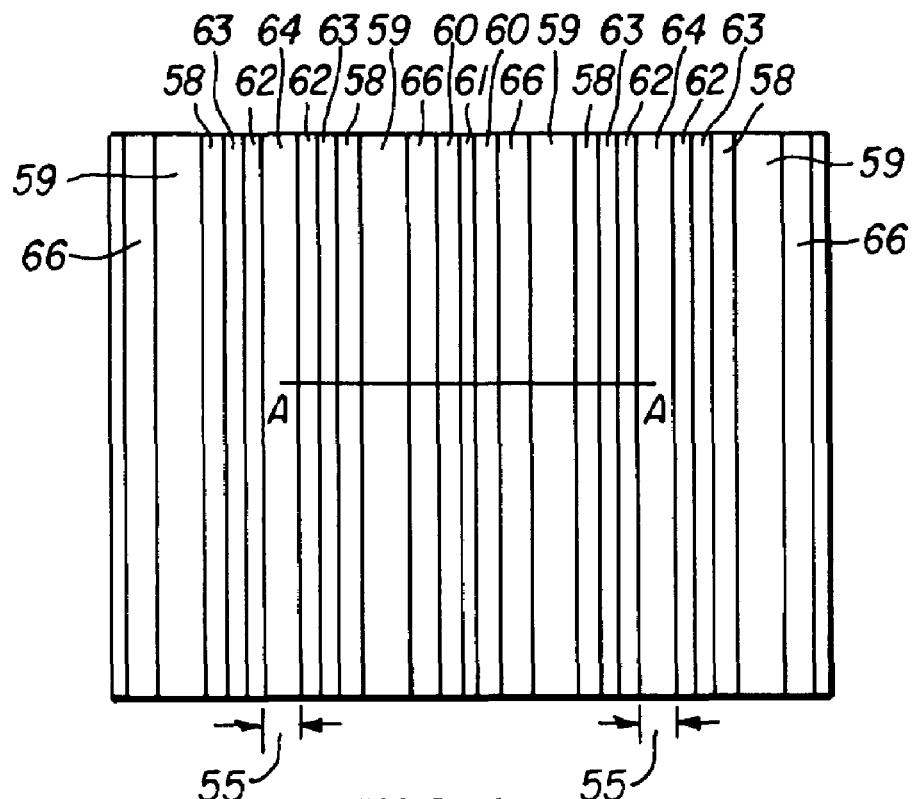
FIG. 1 is a top plan view of a semiconductor apparatus according to a first embodiment of the invention.
Figure 2:
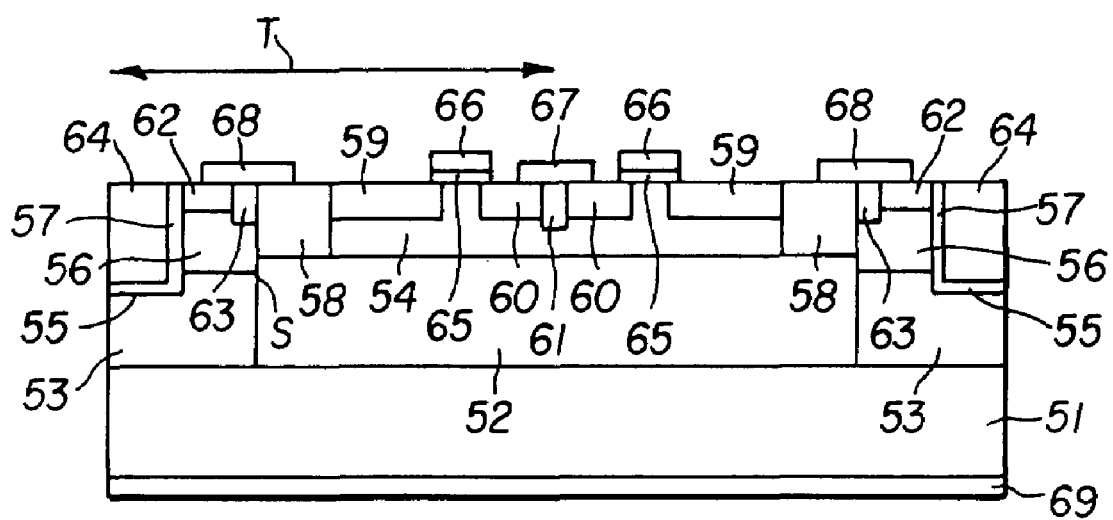
FIG. 2 is a cross-sectional view along the line segment A-A in FIG. 1.
Figure 3:
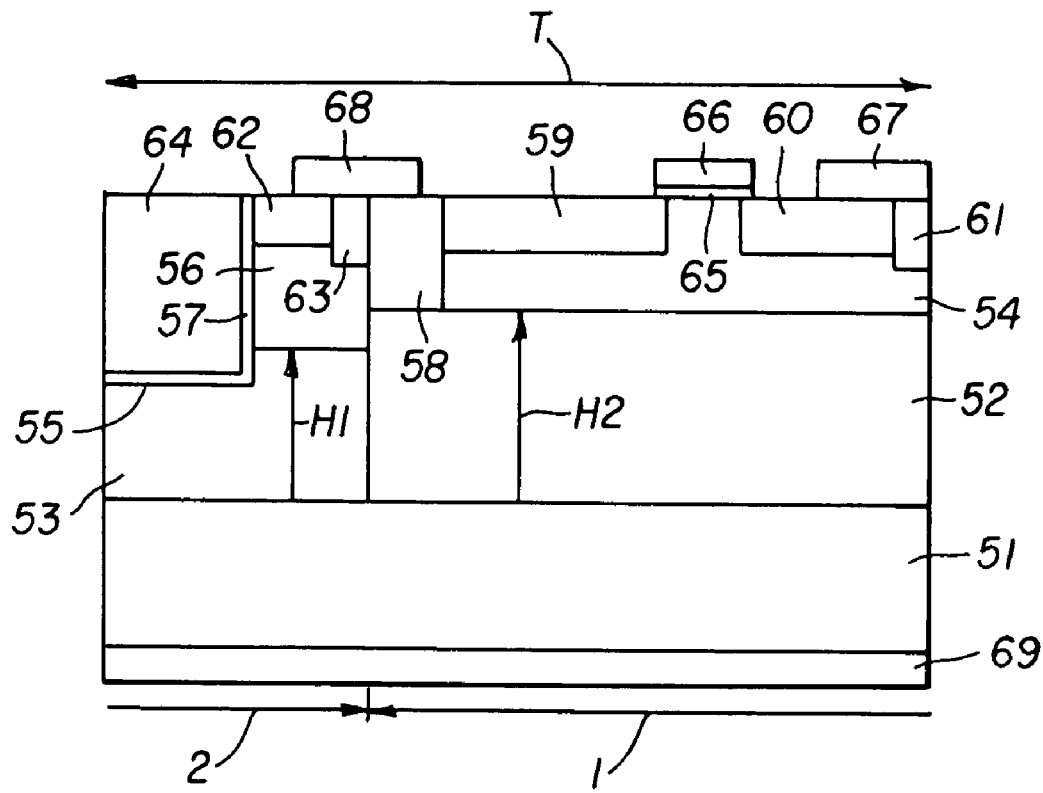
FIG. 3 is an expanded cross-sectional view of the section T in FIG. 2.

FIG. 1 is a top plan view of a semiconductor apparatus according to the first embodiment of the invention. FIG. 2 is a cross-sectional view along the line segment A-A in FIG. 1. FIG. 3 is an expanded cross-sectional view of the section T in FIG. 2. In FIG. 1, first source electrode 67 and metal films 68 serving as a second source electrode and a first drain electrode are omitted to clearly illustrate the arrangement of the semiconductor regions.

Referring now to FIGS. 1 through 3, a partial SOI substrate according to the first embodiment includes: an $n^+$-type semiconductor base material serving as second $n^+$-type drain region 51; oxide film 52 formed selectively on the $n^+$-type semiconductor base stuff, oxide film 52 having a predetermined thickness; an n-type semiconductor layer formed on the area of the $n^+$-type semiconductor base stuff where oxide film 52 is not formed, the n-type semiconductor layer being thinner than oxide film 52, the n-type semiconductor layer serving as a second n-type drift region 53; a p-type semiconductor layer serving as second p-type base region 56 on the n-type semiconductor layer; and a p-type semiconductor layer serving as first p-type base region 54 on oxide film 52. The partial SOI substrate is used to form a semiconductor apparatus according to the first embodiment that includes a first lateral MOSFET having a planar gate structure and a second vertical MOSFET having a trench gate structure.

The first MOSFET includes: oxide film 52 formed locally; first p-type base region 54 on oxide film 52, first p-type base region 54 being shaped as a stripe; first n-type drift region 59 formed in the surface portion of first p-type base region 54; first $n^+$-type source region 60 and first $p^+$-type contact region 61 formed in the other surface portion of first p-type base region 54, first $n^+$-type source region 60 and first $p^+$-type contact region 61 that are spaced apart from first n-type drift region 59; first $n^+$-type drain region 58 formed through first p-type base region 54 down to oxide film 52, first $n^+$-type drain region 58 in contact with first n-type drift region 59; first gate insulator film 65 on the extended portions of first p-type base region 54 extended between first n-type drift region 59 and first $n^+$-type source region 60; first gate electrode 66 on first gate insulator film 65; and first source electrode 67 on first $n^+$-type source region 60 and first $p^+$-type contact region 61.

The second MOSFET includes: second n-type drift region 53 formed on the area of the $n^+$-type semiconductor base stuff serving as second $n^+$-type drain region 51, on which oxide film 52 is not formed; second p-type base region 56 formed in the surface portion of second n-type drift region 53, second p-type base region 56 being shaped as a stripe; trench 55 formed through p-type base region 56 down to second n-type drift region 53, trench 55 being shaped as a stripe extending in parallel to the stripe of first p-type base region 54; second gate insulator film 57 formed on the side wall of trench 55; second $n^+$-type source region 62 and second $p^+$-type contact region 63 formed in the surface portion of second p-type base region 56; gate electrode 64 in trench 55; metal film 68 formed on first $n^+$-type drain region 58 and second $n^+$-type source region 62, metal film 58 serving as a first drain electrode and a second source electrode; and second drain electrode 69 formed on second $n^+$-type drain region 51.

In the semiconductor apparatus according to the first embodiment, the height H1 of the pn-junction between second n-type drift region 53 and second p-type base region 56 from the surface of second $n^+$-type drain region 51 is set to be lower than the height H2 of oxide film 52 from the surface of second $n^+$-type drain region 51. Since the end portion S of the pn-junction between second n-type drift region 53 and second p-type base region 56 is brought into contact with oxide film 52 due to the configuration described above, oxide film 52 serves as a field plate when a voltage is applied to the semiconductor apparatus according to the first embodiment. Since equipotential lines are formed in oxide film 52 serving as a field plate as described later with reference to FIG. 5, a high breakdown voltage is obtained.

When the breakdown voltage of the semiconductor apparatus according to the first embodiment is designed to be 30 V, the half cell pitch for first MOSFET section 1 is 4.5 μm, the half cell pitch for second MOSFET section 2 is 0.75 μm, and the total length of the half cell pitches is T described in FIG. 2. Oxide film 52 in the SOI substrate is 1.4 μm in thickness. A super junction layer is formed below first n-type drift region 59 in first MOSFET section 1 by leaving a part of heavily doped first p-type base region 54 (that is first p-type base region 54 below first n-type drift region 59 in FIG. 3) below first n-type drift region 59. Now the results of breakdown voltage simulations for the semiconductor apparatus according to the first embodiment will be described below.

Figure 4:
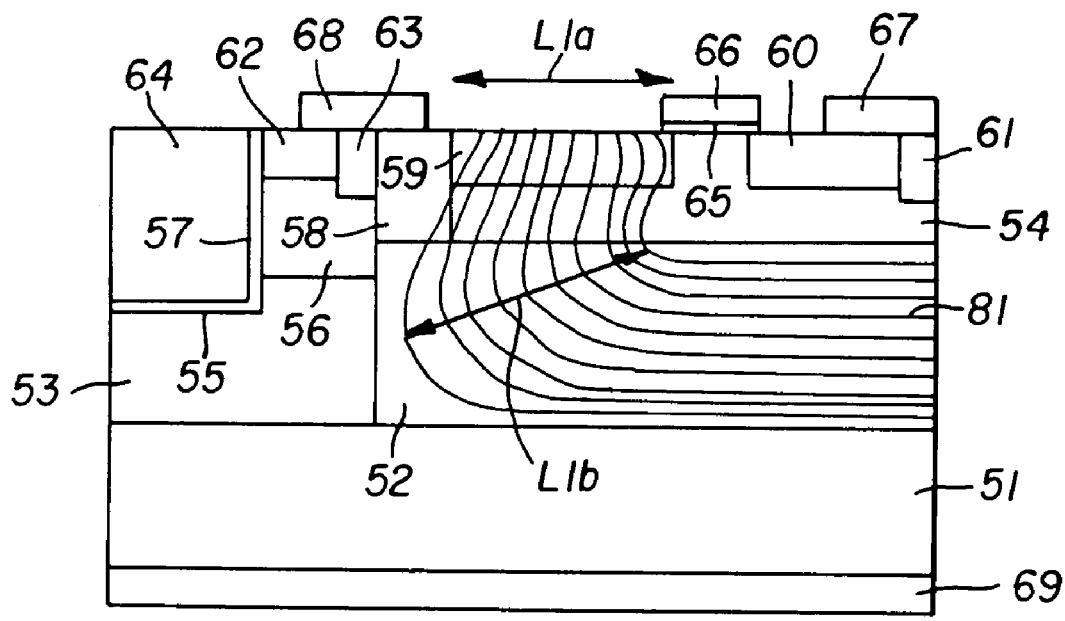
FIG. 4 describes the equipotential curves simulating the breakdown voltage of the semiconductor apparatus according to the first embodiment when a second MOSFET is ON and a first MOSFET is OFF.
Figure 5:
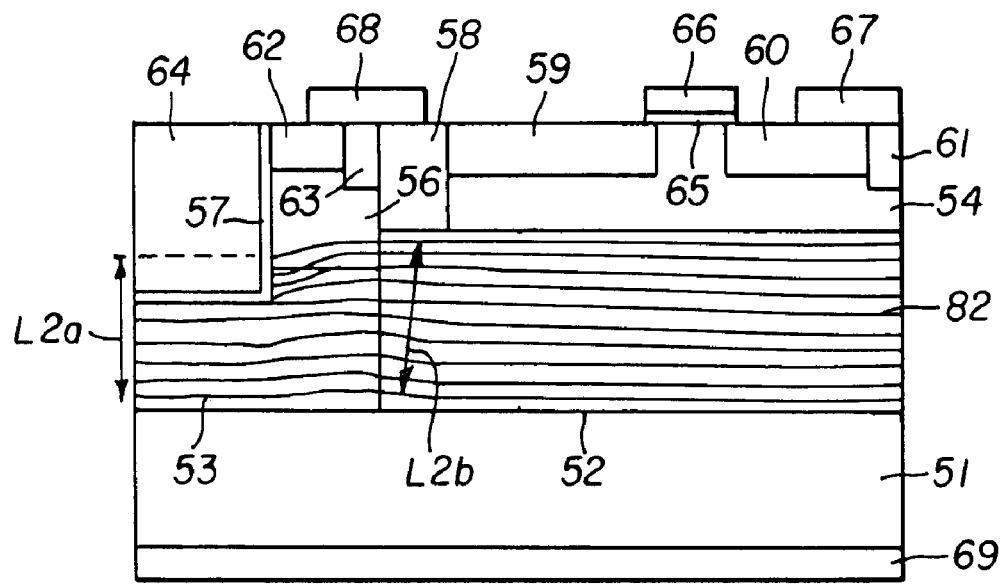
FIG. 5 describes the equipotential curves simulating the breakdown voltage of the semiconductor apparatus according to the first embodiment when the first MOSFET is ON and the second MOSFET is OFF.

FIG. 4 describes the equipotential curves simulating the breakdown voltage of the semiconductor apparatus according to the first embodiment when second MOSFET 2 is ON and first MOSFET 1 is OFF. FIG. 5 describes the equipotential curves simulating the breakdown voltage of the semiconductor apparatus according to the first embodiment when first MOSFET 1 is ON and second MOSFET 2 is OFF.

In FIGS. 4 and 5, equipotential curves 81 and 82 are drawn at the interval of 3 V. The breakdown voltage is 32.1 V for first MOSFET section 1 and 33.4 V for second MOSFET section 2. As shown in FIG. 4, the range L2a, for which equipotential curves 81 are distributing in oxide film 52, is longer than the range L1a, for which equipotential curves 81 are distributing in first MOSFET section 1. As shown in FIG. 5, the range L2b, for which equipotential curves 82 are distributing in oxide film 52, is longer than the range L2a, for which equipotential curves 82 are distributing in second MOSFET section 2. Therefore, the depletion of first and second n-type drift regions 59 and 53 is promoted such that the depletion thereof is affected by the potential distribution in oxide film 52. The impurity concentration is $2.0 \times 10^{17}$ cm$^{-3}$ for first n-type drift region 59 in first MOSFET section 1 and $3.0 \times 10^{16}$ cm$^{-3}$ for second n-type drift region 53 in second MOSFET section 2. By distributing the equipotential curves in oxide film 52, the depletion of first and second n-type drift regions 59 and 53 is promoted. And, by employing the structure as described above, first and second n-type drift regions 59 and 53 can be doped more heavily than the first and second n-type drift regions in the conventional structure. The impurity concentration in the conventional structure is $1.6 \times 10^{17}$ cm$^{-3}$ for first n-type drift region 59 in first MOSFET section 1 and $2.5 \times 10^{16}$ cm$^{-3}$ for second n-type drift region 53. As a result, the ON-resistance is reduced and the semiconductor chip is smaller than that for the conventional structure.

Although first and second MOSFET sections 1 and 2 are designed to exhibit almost the same breakdown voltage according to the first embodiment, first and second MOSFET sections 1 and 2 may be designed to exhibit different breakdown voltages by changing the impurity concentration in first n-type drift region 59 or second n-type drift region 53, by changing the length (current path length) of first n-type drift region 59 or second n-type drift region 53, or by changing the thickness of oxide film 52. First MOSFET section 1 is illustrated by one cell and second MOSFET section 2 is illustrated by one cell according to the first embodiment. Alternatively, first MOSFET section 1 and second MOSFET section 2 are provided with a group of adjacent cells and the cell group for first MOSFET section 1 and the cell group for second MOSFET section 2 are arranged alternately so that the current capacities thereof may be variable.

The semiconductor apparatus according to the first embodiment integrates the lateral planar MOSFET (first MOSFET section 1) and the vertical trench MOSFET (second MOSFET section 2) using a partial SOI substrate and separates first p-type base region 54 in first MOSFET section 1 and second n-type drift region 53 in second MOSFET section 2 in the depth direction by oxide film 52 buried in the semiconductor substrate. In other words, the device separation region is not extended laterally, nor is there any wide useless area that remains according to the first embodiment. This is in contrast to a structure in which both MOSFET sections 1 and 2 are formed of lateral planar MOSFETs. Therefore, the semiconductor chip size is reduced according to the first embodiment. Since two kinds of MOSFET sections 1 and 2 are formed adjacent to each other in a unit cell, MOSFET sections 1 and 2 may be connected easily. Since MOSFET sections 1 and 2 are arranged alternately, heat generating locations are distributed uniformly throughout the active region and, therefore, heat generation is smoothed out over the entire chip.

When incorporating the semiconductor apparatus according to the invention into a circuit, it is necessary to arbitrarily change the ON-resistance values relating to the current capacities of the MOSFETs on the low and high sides, or to arbitrarily change the capacitance between the gate and the drain relating to the switching frequency. The ON-resistance and the capacitance between the gate and the drain can be changed by changing the area ratio of the high-side MOSFET and the low-side MOSFET, or by changing the number of the trench gate per a unit cell.

Figure 6:
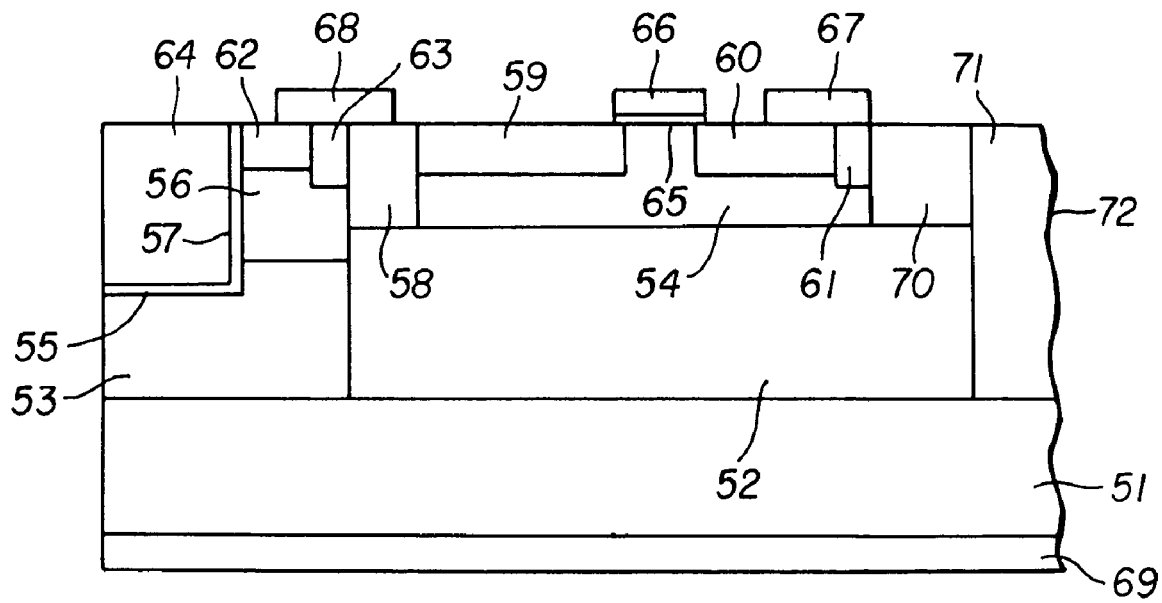
FIG. 6 is a cross-sectional view of the semiconductor apparatus according to the first embodiment including an edge termination in the edge portion thereof.

FIG. 6 is a cross-sectional view of the semiconductor apparatus according to the first embodiment including an edge termination in the edge portion thereof. Referring now to FIG. 6, an oxide film 70 continuous to oxide film 52 is formed adjacent to the outermost first p$^+$-type contact region 61 such that oxide film 70 is exposed. N-type region 71 is formed outside oxide film 70 such that n-type region 71 is in contact with second n$^+$-type drain region 51. N-type region 71 and second n$^+$-type drain region 51 are cut, resulting in a scribe line 72. Scribe line 72 is biased at the potential of second drain electrode 69 (drain potential). The breakdown voltage is secured by oxide film 70 sandwiched between first p$^+$-type contact region 61 and n-type region 71. This configuration prevents the breakdown voltage from being affected adversely by scribe line 72 on the edge and providing an edge termination having a short edge length, which minimizes the leakage current. The edge termination is formed on the circumference of the semiconductor chip.

Figure 7:
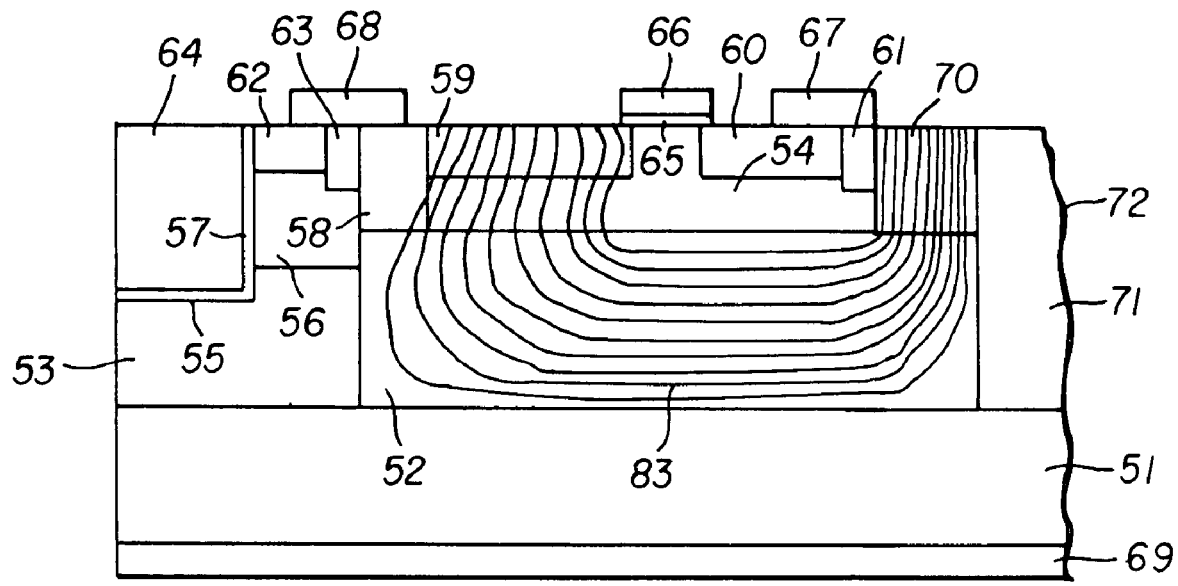
FIG. 7 shows the simulated equipotential curves in the portion of the semiconductor apparatus shown in FIG. 6 when a voltage is applied.

FIG. 7 shows the simulated equipotential curves in the portion of the semiconductor apparatus shown in FIG. 6. The edge length (the total length of oxide film 70 and n-type region 71) is 1.5 µm. In FIG. 7, the equipotential curves are drawn at the interval of 3 V. It has been confirmed that the edge termination secures a breakdown voltage of 32.1 V in the same manner as first MOSFET section 1 does.

Figure 26:
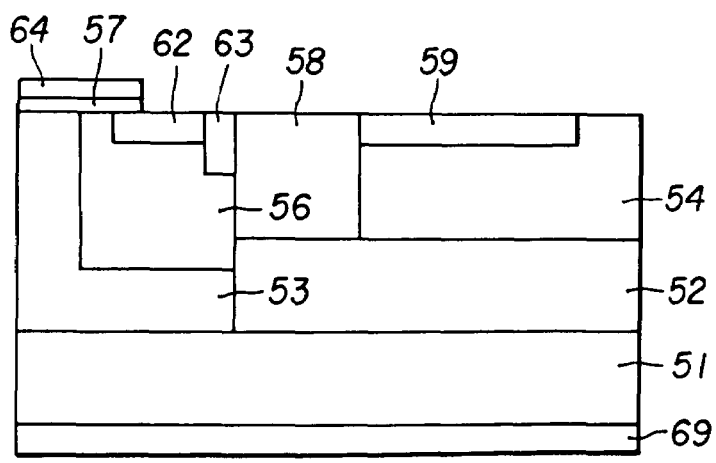
FIG. 26 is a cross-sectional view of a semiconductor apparatus according to the invention that includes a vertical device having a planar gate structure.

Although the first embodiment of the invention has been described in connection with a vertical device (second MOSFET section 2) having a trench gate structure, a vertical device having a planar gate structure as shown in FIG. 26 may be employed for the second MOSFET section with no problem.

The semiconductor apparatus according to any of the first through fourth embodiments of the invention includes first MOSFET section 1 and second MOSFET section 2. In integrating a vertical semiconductor device and a lateral semiconductor device using a partial SOI substrate, the ON-resistance of the vertical semiconductor device may be reduced by forming second MOSFET section 2 solely of the vertical semiconductor device. The lateral semiconductor device may be formed in a semiconductor layer formed on oxide film 52 in the same manner as according to the first embodiment. The conductivity type of the semiconductor layer on oxide film 52 may be an n-type or a p-type with no problem. The vertical semiconductor device and the lateral semiconductor device may be separated by first n$^+$-type drain region 58 and such a junction separation layer or by region 76 described later with reference to FIG. 10 and such an insulator layer.

An IGBT may be employed for the vertical semiconductor device with no problem. When an IGBT is employed for the vertical semiconductor device, second n$^+$-type drain region 51 is replaced by a p⁺-type layer or by a laminate including a p⁺-type layer and an n⁺-type layer on the p⁺-type layer.

Second Embodiment

Figure 8:
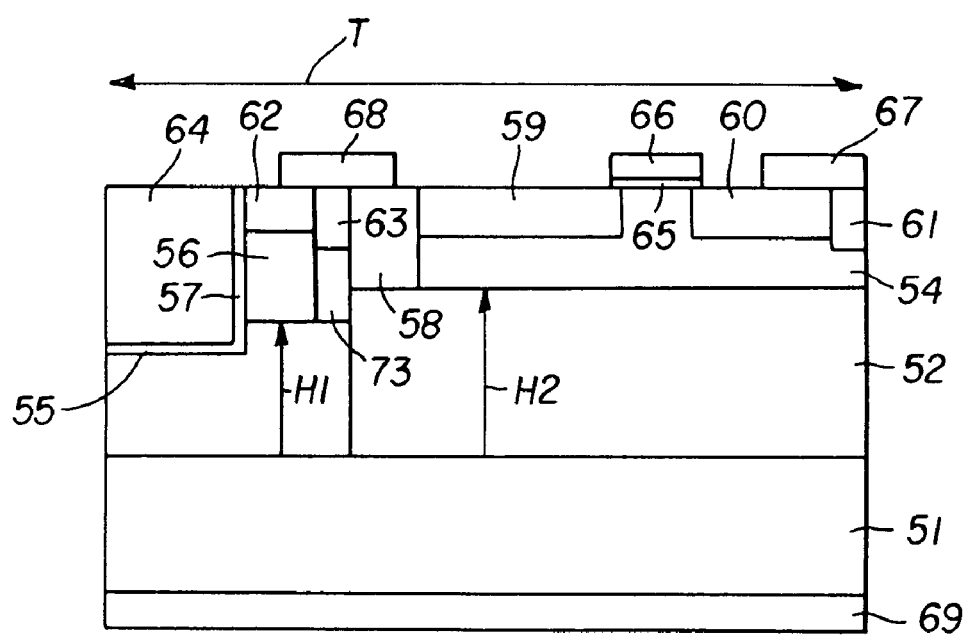
FIG. 8 is a cross-sectional view of a semiconductor apparatus according to a second embodiment of the invention.

FIG. 8 is a cross-sectional view of a semiconductor apparatus according to the second embodiment of the invention. FIG. 8 is a counterpart of FIG. 3. The semiconductor apparatus shown in FIG. 8 is different from the semiconductor apparatus shown in FIG. 3 in that p⁺-type region 73 is formed beneath second p⁺-type contact region 63 such that p⁺-type region 73 is in contact with p⁺-type contact region 63 and extended down to second n-type drift region 53. The semiconductor apparatus in FIG. 8 exhibits the same effects as the semiconductor apparatus in FIG. 3 does. Alternatively, second p⁺-type contact region 63 may be extended down to second n-type drift region 53 with no problem.

Since p⁺-type region 73 in the semiconductor apparatus shown in FIG. 8 facilitates stopping the depletion layer that has expanded throughout second p-type base region 56, the insulating separation of first and second MOSFET sections 1 and 2 is ensured. Since p⁺-type region 73 disposed as shown in FIG. 8 prevents the parasitic thyristor, formed of first p⁺-type contact region 61, first p-type base region 54, first n⁺-type drain region 58, second p-type base region 56, second n-type drift region 53, and second n⁺-type drain region 51 in FIG. 3, from conducting thyristor operations, the noise withstanding capability of the semiconductor apparatus according to the second embodiment is improved.

Third Embodiment

Figure 9:
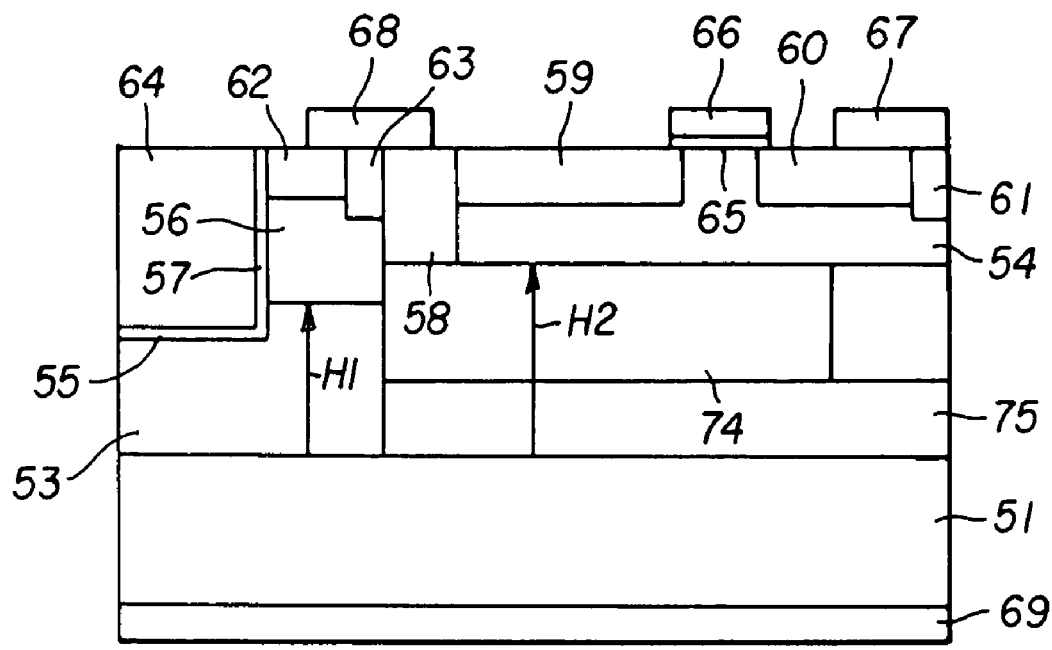
FIG. 9 is a cross-sectional view of a semiconductor apparatus according to a third embodiment of the invention.

FIG. 9 is a cross-sectional view of a semiconductor apparatus according to the third embodiment of the invention. FIG. 9 is a counterpart of FIG. 3. The semiconductor apparatus shown in FIG. 9 is different from the semiconductor apparatus shown in FIG. 3 in that the foregoing oxide film 52 is thinned to be oxide film 74, p-type region 75 is formed between second n⁺-type drain region 51 and oxide film 74, and p-type region 75 is connected to p-type base region 54 via an opening formed in oxide film 74 (below first n⁺-type source region 60 and first p⁺-type contact region 61 in FIG. 9). Since a super junction structure is formed of p-type region 75 and second n-type drift region 53, depletion layers expand into p-type region 75 and second n-type drift region 53, when second MOSFET section 2 is in the OFF-state. Since the breakdown voltage shared by oxide film 74 is reduced, oxide film 74 may be made thin. By virtue of the super junction structure, second n-type drift region 53 may be doped more heavily while a certain breakdown voltage is secured, even when oxide film 74 serving as a field plate is thinner than oxide film 52 in FIG. 3. By doping second n-type drift region 53 more heavily, the ON-resistance and the semiconductor chip size are reduced.

In FIG. 9, p-type region 75 and first p-type region 54 are connected with each other via a semiconductor layer formed integrally with first p-type region 54. By connecting p-type region 75 and first p-type region 54 with the semiconductor layer formed integrally with first p-type region 54, the equipotential curves are extended not only into oxide film 74 but also into p-type region 75. By extending the equipotential curves also through p-type region 75, a high breakdown voltage is secured, even when oxide film 74 is thin.

Fourth Embodiment

Figure 10:
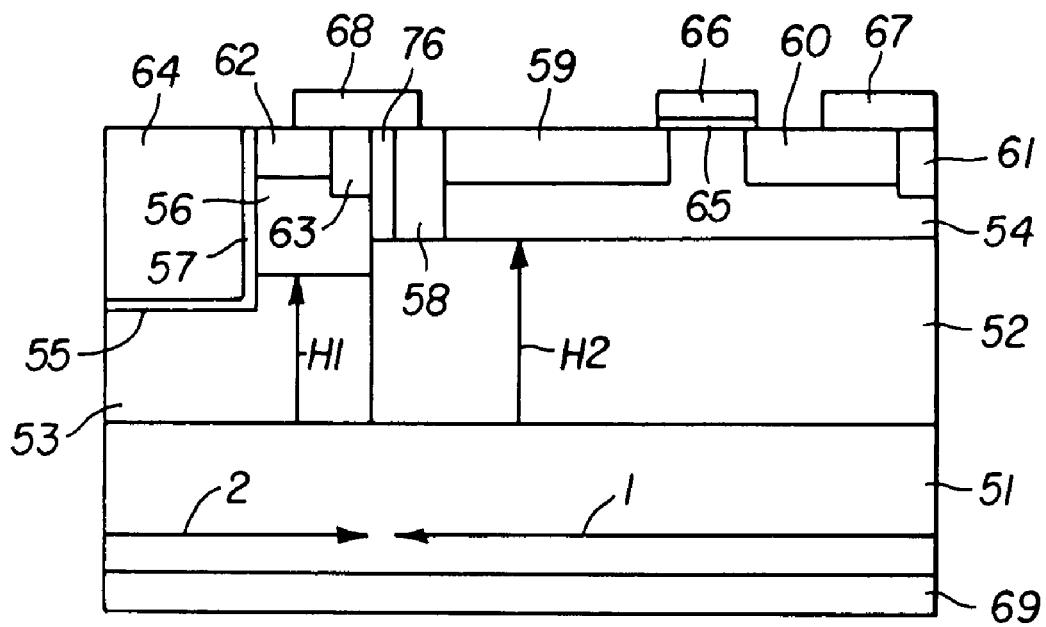
FIG. 10 is a cross-sectional view of a semiconductor apparatus according to a fourth embodiment of the invention.

FIG. 10 is a cross-sectional view of a semiconductor apparatus according to the fourth embodiment of the invention. FIG. 10 is a counterpart of FIG. 3. The semiconductor apparatus shown in FIG. 10 is different from the semiconductor apparatus shown in FIG. 3 in that oxide film 76 separates first MOSFET section 1 and second MOSFET section 2 from each other in FIG. 10. A nitride film and such an insulator film may be used in substitution for oxide film 76 with no problem. Since the equipotential curves are extended into oxide films 52 and 76 in the same manner as in the semiconductor apparatus shown in FIG. 3, the same effects as the semiconductor apparatus shown in FIG. 3 exhibits are obtained. However, the chip size for the semiconductor apparatus according to the fourth embodiment is larger than the chip size for the semiconductor apparatus according to the first embodiment due to the provision of oxide film 76. Since oxide film 76 separates first and second MOSFETs 1 and 2 from each other completely, no parasitic thyristor is caused. In FIG. 10, H2 is higher than H1. Even if H1 is higher than H2, there is no problem, since the end portion of the pn-junction between second n-type drift region 53 and second p-type base region 56 is in contact with oxide film 76.

Fifth Embodiment

Figure 11:
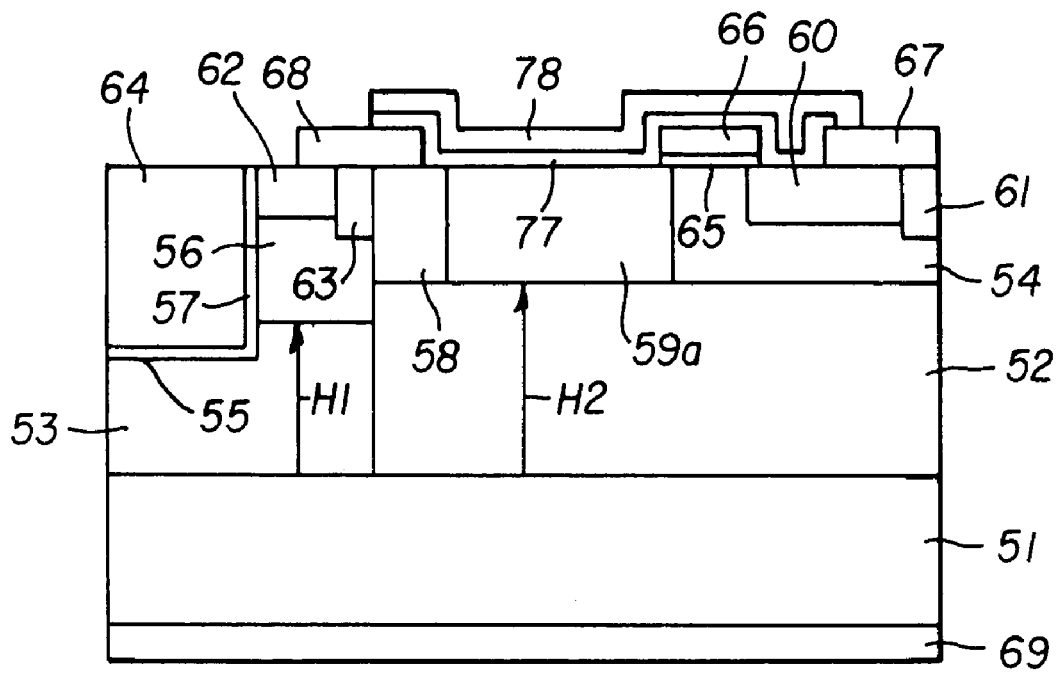
FIG. 11 is a cross-sectional view of a semiconductor apparatus according to a fifth embodiment of the invention.

FIG. 11 is a cross-sectional view of a semiconductor apparatus according to the fifth embodiment of the invention. FIG. 11 is a counterpart of FIG. 3. The semiconductor apparatus shown in FIG. 11 is different from the semiconductor apparatus shown in FIG. 3 in that first n-type drift region 59a in first MOSFET section 1 is extended down to oxide film 52 and field plate 78 is formed above first n-type drift region 59a with interlayer insulator film (field insulator film) 77 interposed between first n-type drift region 59a and field plate 78.

In the semiconductor apparatus shown in FIG. 3, first n-type drift region 59 and first p-type base region 54 constitute a super junction such that a certain breakdown voltage is secured by the super junction and oxide film 52. In the semiconductor apparatus shown in FIG. 11, a certain breakdown voltage is secured by first n-type drift region 59a, which is a single diffusion region, and oxide film 52. Since the depletion layer in first n-type drift region 59a is liable to expand laterally due to the provision of field plate 78, a certain breakdown voltage is secured easily. Since first n-type drift region 59a in FIG. 11 is deeper than first n-type drift region 59 in FIG. 3, the ON-resistance is reduced. Although field plate 78 is in contact with first source electrode 67 in FIG. 11, field plate 78 is not brought into contact with first source electrode 67 sometimes (when the breakdown voltage is low and in such cases).

Sixth Embodiment

Figure 12:
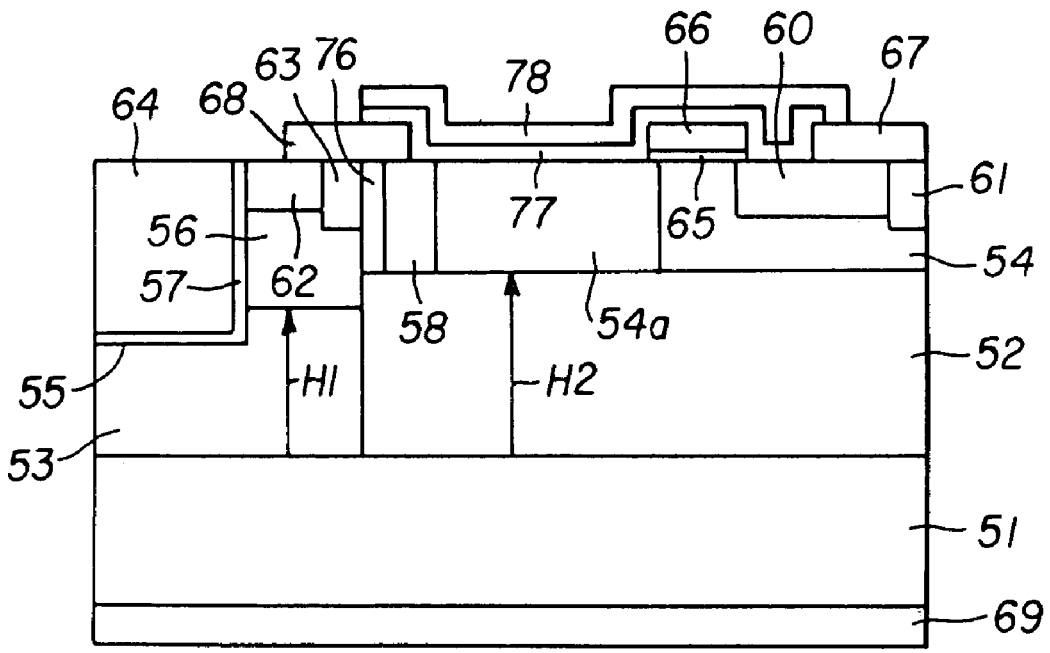
FIG. 12 is a cross-sectional view of a semiconductor apparatus according to a sixth embodiment of the invention.

FIG. 12 is a cross-sectional view of a semiconductor apparatus according to the sixth embodiment of the invention. FIG. 12 is a counterpart of FIG. 11. The semiconductor apparatus shown in FIG. 12 is different from the semiconductor apparatus shown in FIG. 11 in that first MOSFET section 1 and second MOSFET section 2 are separated from each other by oxide film 76. The semiconductor apparatus shown in FIG. 12 exhibits the same effects as the semiconductor apparatus shown in FIG. 11 does. Because of oxide film 76, there is no problem even when H1 is higher than H2.

Seventh Embodiment

Figure 13:
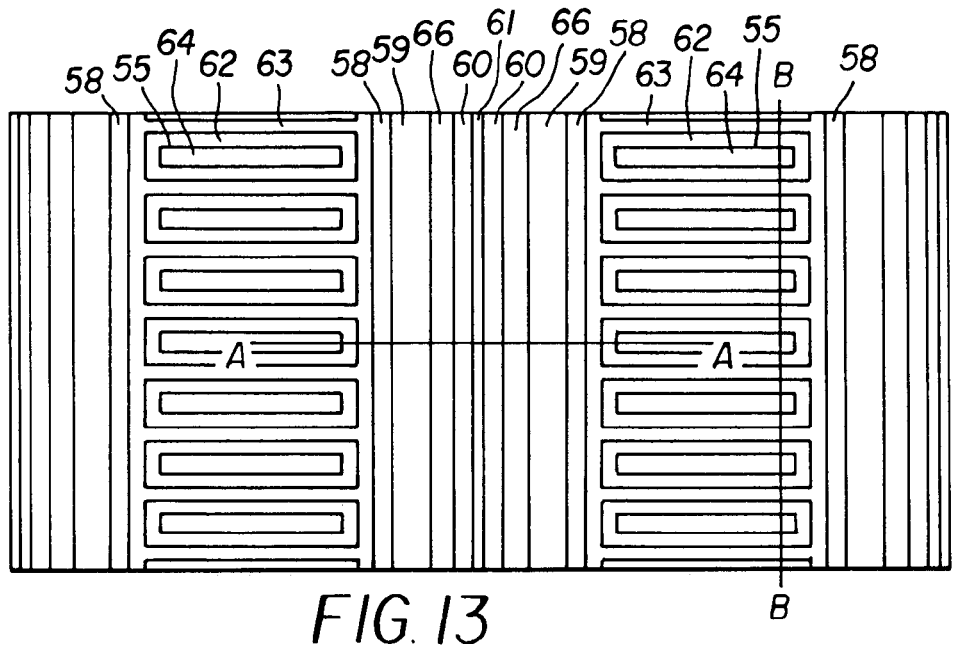
FIG. 13 is a top plan view of a semiconductor apparatus according to a seventh embodiment of the invention.
Figure 14:
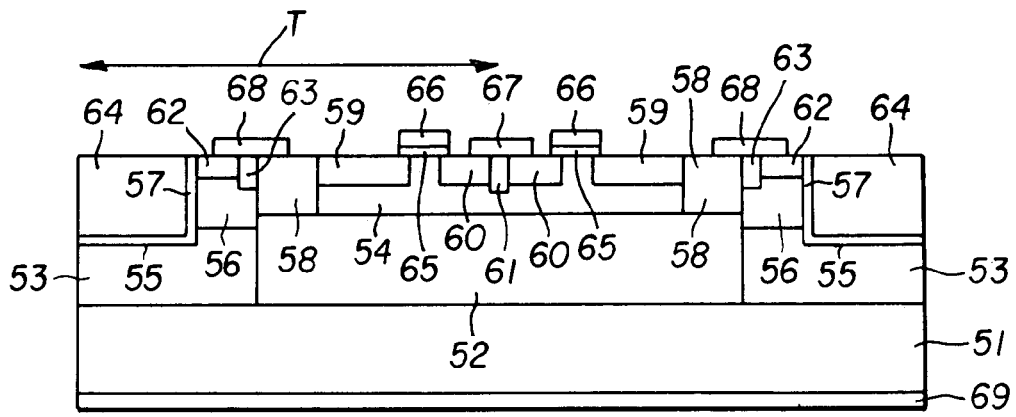
FIG. 14 is a cross-sectional view along the line segment A-A of FIG. 13.
Figure 15:
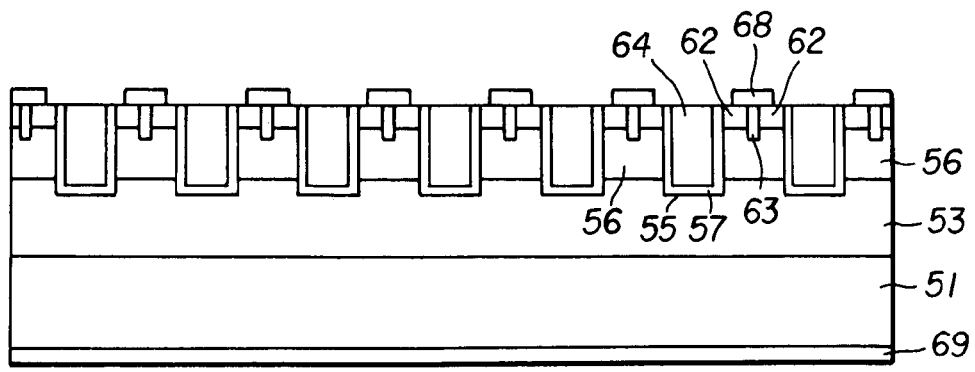
FIG. 15 is a cross-sectional view along the line segment B-B of FIG. 13.

FIG. 13 is a top plan view of a semiconductor apparatus according to the seventh embodiment of the invention. FIG. 13 is a counterpart of FIG. 1. FIG. 14 is a cross-sectional view along the line segment A-A of FIG. 13. FIG. 15 is a cross-sectional view along the line segment B-B of FIG. 13.

The semiconductor apparatus shown in FIGS. 13 through 15 is different from the semiconductor apparatus shown in FIGS. 1 through 3 in that the stripe of first p-type base region 54 and the extension line in the longitudinal direction of stripe-shaped second p-type base region 56 cross each other at right angles in the semiconductor apparatus shown in FIGS. 13 through 15. By changing the length of second p-type base region 56 in the longitudinal direction thereof, desired characteristics are obtained.

Eighth Embodiment

Figure 16:
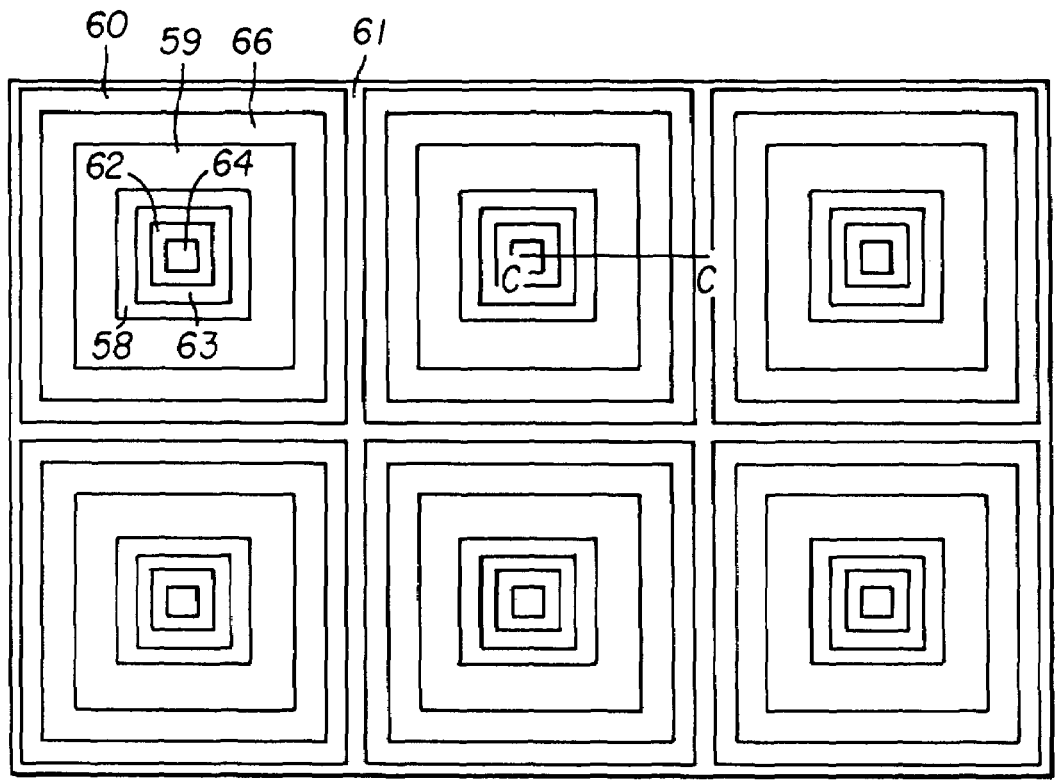
FIG. 16 is a top plan view of a semiconductor apparatus according to an eighth embodiment of the invention.

FIG. 16 is a top plan view of a semiconductor apparatus according to the eighth embodiment of the invention. FIG. 16 is a counterpart of FIG. 1. In FIG. 16, first source electrode 67 and metal films 68 serving as a second source electrode and a first drain electrode are omitted in the same manner as in FIG. 1 to clearly illustrate the arrangement of the semiconductor regions. The cross-sectional view along the line segment C-C in FIG. 16 is similar to the cross-sectional view shown in FIG. 3. The semiconductor apparatus according to the eighth embodiment exhibits the same effects as the semiconductor apparatus according to the first embodiment does.

Since second MOSFET section 2 is surrounded by first MOSFET section 1 in the structure shown in FIG. 16, the channel circumference length in first MOSFET section 1 is longer than the channel circumference length in second MOSFET section 2. Therefore, the ON-resistance in first MOSFET section 1 is reduced more easily than the ON-resistance in second MOSFET section 2 according to the eighth embodiment.

Ninth Embodiment

Figure 17:
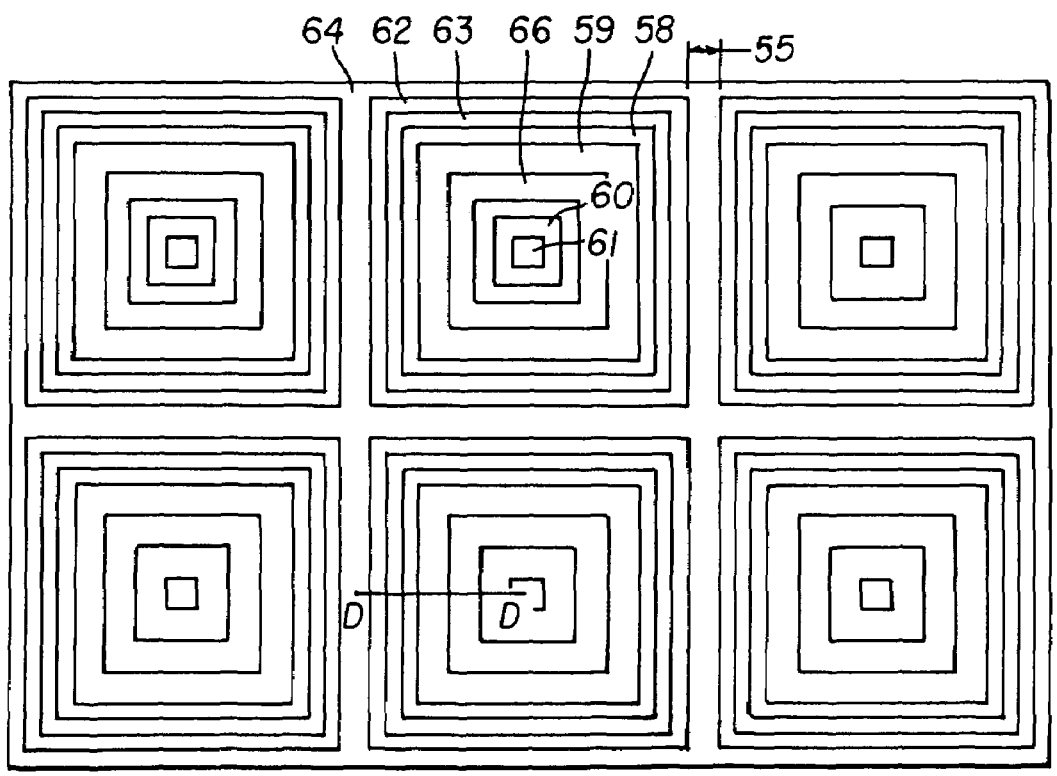
FIG. 17 is a top plan view of a semiconductor apparatus according to a ninth embodiment of the invention.

FIG. 17 is a top plan view of a semiconductor apparatus according to the ninth embodiment of the invention. FIG. 17 is a counterpart of FIG. 1. In FIG. 17, first source electrode 67 and metal films 68 serving as a second source electrode and a first drain electrode are omitted in the same manner as in FIG. 1 to clearly illustrate the arrangement of the semiconductor regions. The cross-sectional view along the line segment D-D in FIG. 17 is similar to the cross-sectional view shown in FIG. 3. The semiconductor apparatus according to the ninth embodiment exhibits the same effects as the semiconductor apparatus according to the first embodiment does.

Since first MOSFET section 1 is surrounded by second MOSFET section 2 in the structure shown in FIG. 17, the channel circumference length in second MOSFET section 2 is longer than the channel circumference length in first MOSFET section 1. Therefore, the ON-resistance in second MOSFET section 2 is reduced more easily than the ON-resistance in first MOSFET section 1 according to the ninth embodiment.

Tenth Embodiment

FIGS. 18 through 21 are cross-sectional views describing the steps in the manufacturing method according to the tenth embodiment of the invention for manufacturing the semiconductor apparatus according to the first embodiment. FIGS. 18 through 21 are the counterparts of FIG. 2.

Figure 18:
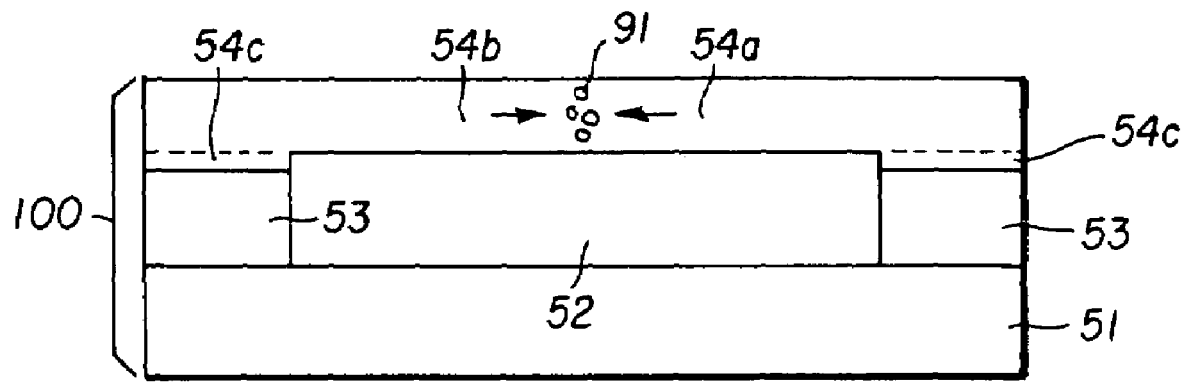
FIG. 18 is a cross-sectional view describing a manufacturing step in the manufacturing method according to a tenth embodiment of the invention for manufacturing the semiconductor apparatus according to the first embodiment.

Referring now to FIG. 18, local oxide film 52 having a predetermined thickness is formed selectively on an $n^+$-type semiconductor base material, which will be a first $n^+$-type drain region 51. Then, n-type semiconductor layers, which will be second n-type drift regions 53, are formed on the portions of the $n^+$-type semiconductor base material where there is no oxide film 52, such that second n-type drift region 53 is thinner than oxide film 52. Then, p-type semiconductor layers 54a and 54b, which will be first p-type base region 54 and second p-type base region 56, are formed on oxide film 52 and second n-type drift regions 53, resulting in partial SOI substrate 100.

Alternatively, local oxide film 52 having a predetermined thickness is formed selectively on an $n^+$-type semiconductor base material, which will be first $n^+$-type drain region 51. Then, n-type semiconductor layers, which will be second n-type drift regions 53, are formed on the portions of the $n^+$-type semiconductor base material where there is no oxide film 52, such that second n-type drift region 53 is thicker than oxide film 52. Then, the n-type semiconductor layers are polished to the thickness of oxide film 52 using oxide film 52 for a stopper. Then, illustrated p-type layers 54c are formed by diffusing a p-type impurity from the polished surfaces. Then, p-type semiconductor layers 54a and 54b, which will be first p-type base region 54 and a part of second p-type base regions 56, are formed on oxide film 52 and p-type layers 54c, resulting in partial SOI substrate 101. In this structure, first p-type base region 54 and second p-type base regions 56 are formed of p-type layers 54c and p-type semiconductor layers 54a and 54b.

As described above, partial SOI substrate 100 is formed by the epitaxial growth of n-type semiconductor layers, which will be second n-type drift regions 53, and by the epitaxial growth of p-type semiconductor layers 54a and 54b. The p-type semiconductor layers 54a and 54b on oxide film 52 include epitaxial layers grown on p-type layers 54c on both sides of oxide film 52 and on oxide film 52. The epitaxial layers grown on oxide film 52 are formed by the lateral growth of the epitaxial layers grown on p-type layers 54c. Since the epitaxial layer on oxide film 52 is formed of epitaxial layers grown laterally from both sides of oxide film 52 and brought into contact with each other on the central portion of oxide film 52, many defects 91 are liable to be formed in the contact plane of the laterally grown epitaxial layers (cf. FIG. 18).

Figure 19:
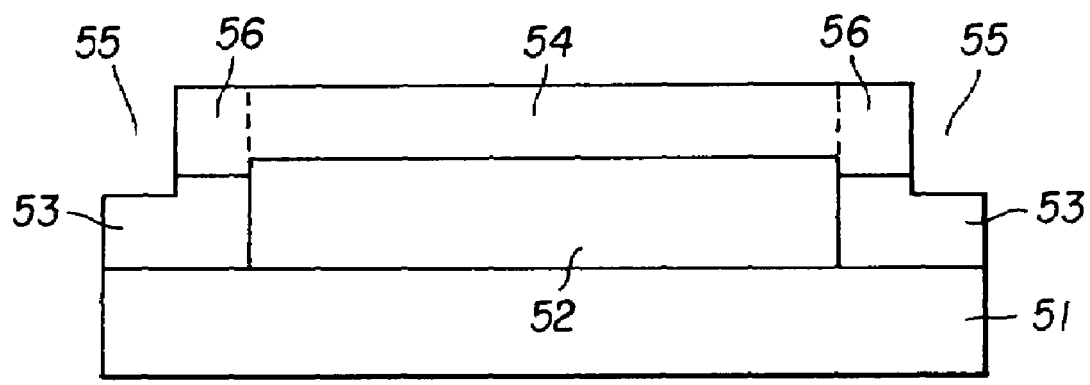
FIG. 19 is a cross-sectional view describing the manufacturing step subsequent to the step described in FIG. 18 for manufacturing the semiconductor apparatus according to the first embodiment.
Figure 20:
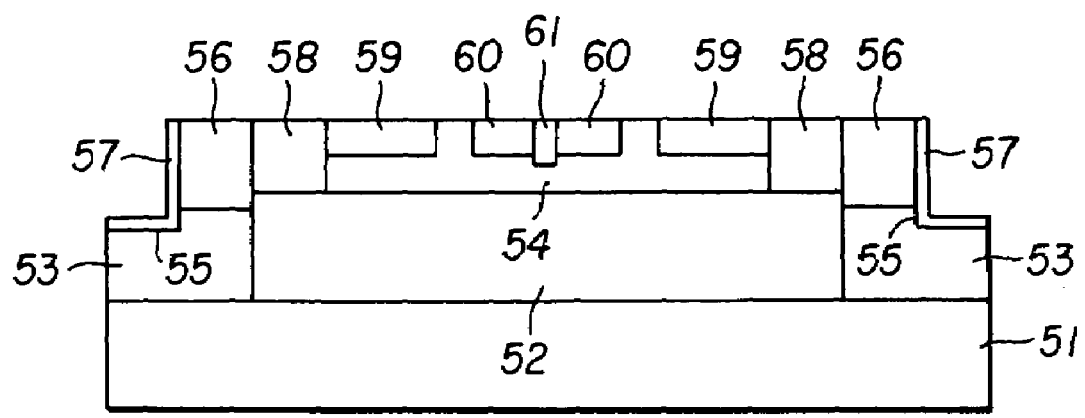
FIG. 20 is a cross-sectional view describing the manufacturing step subsequent to the step described in FIG. 19 for manufacturing the semiconductor apparatus according to the first embodiment.
Figure 21:
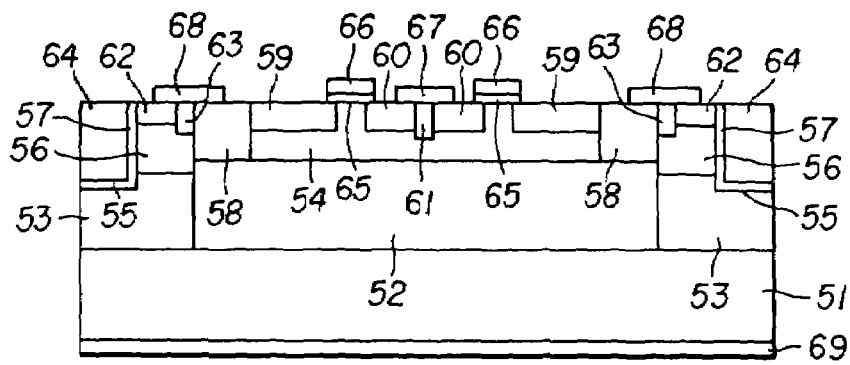
FIG. 21 is a cross-sectional view describing the manufacturing step subsequent to the step described in FIG. 20 for manufacturing the semiconductor apparatus according to the first embodiment.
Figure 22:
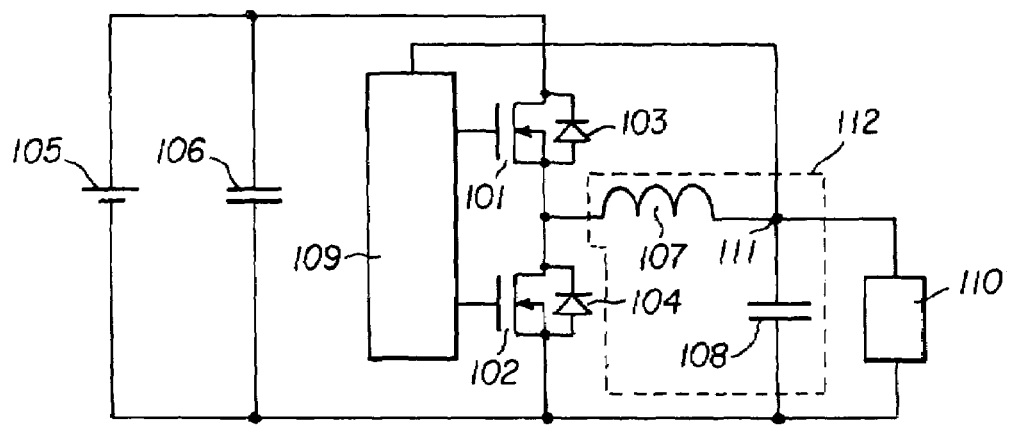
FIG. 22 is a block diagram of a synchronous commutator circuit.
Figure 23:
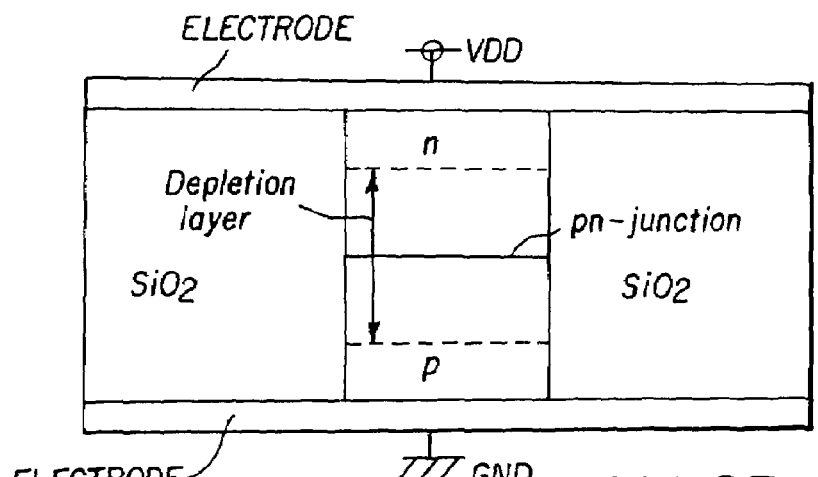
FIG. 23 is cross-sectional view of a semiconductor region and oxide film regions on both sides of the semiconductor structure.
Figure 24A:
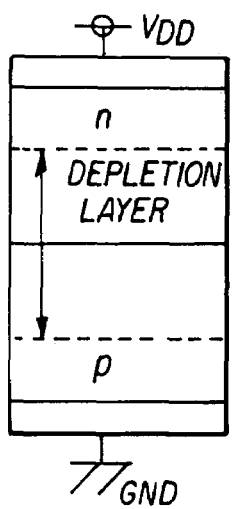
FIG. 24(a) is a cross-sectional view of the semiconductor region of FIG. 23 having a diode structure.
Figure 24B:
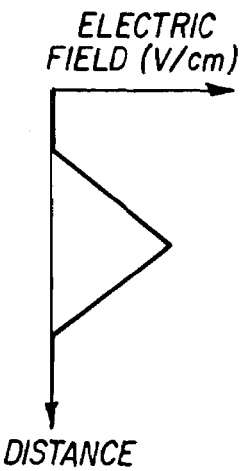
FIG. 24(b) shows an electric field distribution across the diode structure of FIG. 24(a).
Figure 24C:
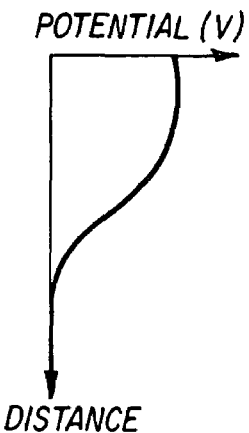
FIG. 24(c) shows a potential distribution across the diode structure of FIG. 24(a).
Figure 25A:
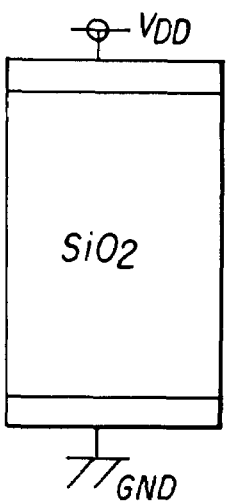
FIG. 25(a) is a cross-sectional view of the oxide film region of FIG. 23 having a capacitor structure.
Figure 25B:
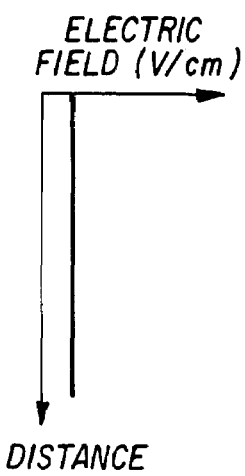
FIG. 25(b) shows an electric field distribution across the capacitor structure of FIG. 25(a).
Figure 25C:
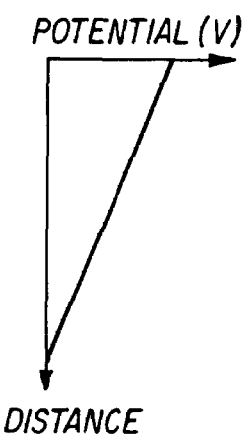
FIG. 25(c) shows a potential distribution across the capacitor structure of FIG. 25(a).

Then, trenches 55 are formed through second p-type base regions 56 above the portions of the $n^+$-type semiconductor base material where there is no oxide film 52, such that trenches 55 are extended down to second n-type drift region 53 (cf. FIG. 19). Next, gate insulator film 56 is formed on the side wall and the bottom surface of trench 55. First $n^+$-type drain regions 58 are formed such that first $n^+$-type drain regions 58 are extended from the surface of first p-type base region 54 down to oxide film 52. First n-type drift regions 59 are formed in the surface portions of first p-type base region 54 such that first n-type drift regions 59 are in contact with the respective first $n^+$-type drain regions 58. First $n^+$-type contact regions 60 and first $p^+$-type contact region 61 are formed in the surface portion of first p-type base region 54 such that first $n^+$-type source regions 60 and first $p^+$-type contact region 61 are spaced apart from first n-type drift regions 59. First $p^+$-type contact region 61 is formed in the above described contact area of the epitaxial layers on oxide film 52, since first $p^+$-type contact region 61 will not adversely affect the breakdown voltage nor the ON-resistance even if defects 91 have been caused (cf. FIG. 20).

Then, first gate insulator film 65 is formed on the extended portion of first p-type base region 54 extended between first n-type drift region 59 and first $n^+$-type source region 60. Then, first gate electrode 66 is formed on first gate insulator film 65. Second n⁺-type source region 62 and second p⁺-type contact region 63 are formed in the surface portion of second p-type base region 56. Gate electrode 64 is formed in trench 55. First source electrode 67 is formed on first n⁺-type source regions 60 and first p⁺-type base region 61. Metal film 68 that will serve as a first drain electrode and a second source electrode is formed from the surface of first n⁺-type drain region 58 to the surface of second n⁺-type source region 62 over second p⁺-type contact region 63. Second drain electrode 69 is formed on second n⁺-type drain region 51. Thus, the semiconductor apparatus according to the first embodiment of the invention that includes first and second MOSFET sections 1 and 2 is completed (cf. FIG. 21).

Thus, a semiconductor device has been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

What is claimed is:

1. A semiconductor device comprising:
   a first semiconductor layer having a first major surface and a second major surface;
   a first insulator film formed selectively on the first major surface of the first semiconductor layer;
   a second semiconductor layer of a first conductivity type formed on the portion of the first semiconductor layer where the first insulator film is not formed;
   a third semiconductor layer of a second conductivity type formed on the first insulator film;
   a fourth semiconductor layer of the second conductivity type formed on the second semiconductor layer or in a surface portion of the second semiconductor layer;
   a seventh semiconductor layer of the first conductivity type extended from the surface of the third semiconductor layer down to the first insulator film;
   a fifth semiconductor layer of the first conductivity type formed in a surface portion of the fourth semiconductor layer;
   a second insulator film on an exposed surface of the fourth semiconductor layer exposed between the second semiconductor layer and the fifth semiconductor layer;
   a first gate electrode on the second insulator film;
   an eighth semiconductor layer of the first conductivity type formed in a surface portion of the third semiconductor layer, the eighth semiconductor layer being in contact with the seventh semiconductor layer;
   a ninth semiconductor layer of the first conductivity type formed in a surface portion of the third semiconductor layer, the ninth semiconductor layer being spaced apart from the eighth semiconductor layer;
   a second gate electrode above the extended portion of the third semiconductor layer extended between the eighth semiconductor layer and the ninth semiconductor layer with a second gate insulator film interposed therebetween;
   a first electrode connected electrically to the fourth semiconductor layer, the fifth semiconductor layer, and the seventh semiconductor layer;
   a second electrode formed on the second major surface of the first semiconductor layer;
   a third electrode connected electrically to the ninth semiconductor layer and the third semiconductor layer; and
   an end portion of the pn-junction between the second semiconductor layer and the fourth semiconductor layer opposite to the gate-electrode-side end portion of the pn-junction being in contact with the first insulator film.

2. The semiconductor device according to claim 1, further comprising a tenth semiconductor layer of the second conductivity type between the seventh semiconductor layer and the fifth semiconductor layer, the tenth semiconductor layer being extended more deeply than the fifth semiconductor layer.

3. The semiconductor device according to claim 2, wherein the tenth semiconductor layer separates the fourth semiconductor layer and the seventh semiconductor layer from each other.

4. The semiconductor device according to claim 3, wherein the tenth semiconductor layer comprises a plurality of impurity diffusion layers.

5. The semiconductor device according to claim 1, further comprising an eleventh semiconductor layer of the second conductivity type in a surface portion of the third semiconductor layer, spaced apart from the second gate electrode with the ninth semiconductor layer interposed therebetween.

6. The semiconductor device according to claim 1, further comprising a third insulator film formed in contact with the first insulator film such that the third insulator film separates the seventh semiconductor layer and the fourth semiconductor layer from each other, and the end portion of the pn-junction between the second semiconductor layer and the fourth semiconductor layer opposite to the first-gate-electrode-side end portion of the pn-junction is in contact with the first insulator film or the third insulator film.

7. The semiconductor device according to claim 1, wherein the eighth semiconductor layer is extended down to the first insulator film.

8. The semiconductor device according to claim 1, further comprising a fourth insulator film on the eighth semiconductor layer, and a field plate on the fourth insulator film.

9. The semiconductor device according to claim 1, wherein the fourth semiconductor layer is formed on the second semiconductor layer; the semiconductor apparatus further comprises a trench adjacent to the fifth semiconductor layer and extended down to the second semiconductor layer; and the exposed surface of the fourth semiconductor layer is in the trench.

10. The semiconductor device according to claim 1, wherein the planar patterns of the third semiconductor layer and the fourth semiconductor layer are stripe-shaped, and the extension line of the fourth semiconductor layer in the longitudinal direction and the longitudinal direction of the third semiconductor layer cross each other at right angles.

11. The semiconductor device according to claim 1, comprising a plurality of structures in which the third semiconductor layer surrounds the fourth semiconductor layer.

12. The semiconductor device according to claim 1, comprising a plurality of structures in which the fourth semiconductor layer surrounds the third semiconductor layer.

13. The semiconductor device according to claim 1, further comprising a twelfth semiconductor layer of the second conductivity type between the first semiconductor layer and the third semiconductor layer.

* * * * *